United States Patent
Kawamura et al.

(10) Patent No.: US 6,323,547 B1
(45) Date of Patent: Nov. 27, 2001

(54) PRESSURE CONTACT TYPE SEMICONDUCTOR DEVICE WITH RINGSHAPED GATE TERMINAL

(75) Inventors: Toshinobu Kawamura; Katsumi Satoh; Mikio Bessho, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/215,626

(22) Filed: Dec. 18, 1998

(30) Foreign Application Priority Data

Jul. 30, 1998 (JP) .................................. 10-215367

(51) Int. Cl.[7] .......................... H01L 23/48; H01L 29/74; H01L 23/42
(52) U.S. Cl. .......................... 257/688; 257/139; 257/147; 257/689; 257/181; 257/182; 257/150; 257/726; 257/730; 257/718
(58) Field of Search .................... 257/139, 488, 257/147, 689, 181, 182, 150, 718, 726, 730

(56) References Cited

U.S. PATENT DOCUMENTS

| | | | |
|---|---|---|---|
| 3,619,731 | * 11/1971 | Baker et al. | 317/234 R |
| 3,950,663 | * 4/1976 | Mead | 310/49 R |
| 4,023,198 | 5/1977 | Malone et al. | |
| 4,188,637 | * 2/1980 | Gerstenkoper et al. | |
| 4,719,500 | * 1/1988 | Tokunoh | |
| 5,777,351 | * 7/1998 | Taguchi et al. | 257/181 |
| 5,929,557 | * 7/1999 | Makishima et al. | 313/309 |
| 6,078,066 | * 6/2000 | Akamatsu et al. | 257/177 |
| 6,093,088 | * 7/2000 | Mitsuhashi et al. | 451/285 |

FOREIGN PATENT DOCUMENTS

| | | |
|---|---|---|
| 0 516 416 | 12/1992 | (EP) . |
| 0 588 026 | 3/1994 | (EP) . |
| 0 729 179 | 8/1996 | (EP) . |
| 0 746 821 | 12/1996 | (EP) . |
| 1 469 973 | 4/1977 | (GB) . |
| 6-188411 | 7/1994 | (JP) . |
| 8-330572 | 12/1996 | (JP) . |

OTHER PUBLICATIONS

Patent Abstracts of Japan, vol. 015, No. 502 (E–1147), Dec. 18, 1991, JP 03 218660, Sep. 26, 1991.

* cited by examiner

Primary Examiner—Alexander O. Williams
(74) Attorney, Agent, or Firm—Oblon, Spivak, McClelland, Maier & Neustadt, P.C.

(57) ABSTRACT

In a GCT device which controls large current at the operating frequency of 1 kHz or more, a ring-shaped gate terminal (10) is made of a magnetic material with the maximum permeability of 15,000 or less in the CGS Gaussian system of units. Further, in the outer end portion of an outer plane portion (10O) of the ring-shaped gate terminal (10), a plurality of slits extending diametrically are provided along the circumference to be coupled to mounting holes (10b).

17 Claims, 5 Drawing Sheets

AF1~AF4 : OBSERVATION POINTS IN ANODE FLANGE
ACu1~ACu4 : OBSERVATION POINTS IN ANODE COPPER BLOCK
G1~G4 : OBSERVATION POINTS IN RING-SHAPED GATE TERMINAL

US 6,323,547 B1

PRESSURE CONTACT TYPE SEMICONDUCTOR DEVICE WITH RINGSHAPED GATE TERMINAL

BACKGROUND OF THE INVENTION

1. Field of the Invention

The present invention relates to a pressure contact type semiconductor device used for a power converter.

2. Background of the Invention

In the field of large-capacity power electronics devices, a snubberless GCT (Gate-Commutated Turn-off) thyristor with the maximum cut-off current of 4000 A and a turn-off storage time of 3 µs or less has been realized to be an alternative to a conventional GTO (Gate Turn-Off) thyristor. The operating principles and the structure of the GCT thyristor is disclosed, for example, in European Patent Publication No. EPO785627A2, Japanese Patent Laid-Open No. 8-330572A, or Mitsubishi Electric Technical Report Vol. 71, No. 12, pp. 61–66. The features of the GCT thyristor are summarized as follows: In the GCT thyristor, a gate terminal which is in contact with a ring gate electrode and extends to the outside of an insulation cylinder is changed from lead-shaped to ring-shaped; and a connection between the GCT thyristor and a gate drive circuit is improved from a lead wire structure to a laminated circuit board structure, as compared with the conventional GTO thyristor. Thus, an inductance of the gate terminal and a metal gate contact is reduced to about one hundredths of an inductance of the GTO thyristor. This makes possible an isotropic supply of reverse gate current to be passed at the time of turn-off, from all the circumferential surfaces of a gate electrode, and also a reduction in the turn-off storage time. Further, in a wafer structure of the GCT thyristor, several thousands of segments are concentrically located in parallel with each other in a several-stage configuration, and a gate electrode region forming an interface with the gate electrode is located at the outermost peripheral portion.

FIG. 4 is a longitudinal cross-sectional view of the structure of a conventional GCT device, including a gate driver. Since a GCT device 1P has a structure bilaterally symmetrical on a central axis CA, only one side of the structure is shown in FIG. 4.

Each reference numeral or character in FIG. 4 indicates each element as follows: 2 is a gate drive device for controlling the GCT device 1P; 3 is a stack electrode for pressurizing the GCI device 1P and drawing current; and 4 indicates a semiconductor substrate (wafer). On the peripheral portion of a first major surface of the semiconductor substrate 4, a ring-shaped gate electrode 4a of aluminum is formed in contact with a gate electrode region, and on the inner portion of the first major surface outside the gate electrode 4a, a plurality of cathode electrodes 4b are concentrically formed. The reference numerals 5 and 6 are a cathode distortion buffer plate (or cathode metal plate) and a cathode post electrode, respectively, which are sequentially stacked one above the other on the cathode electrodes 4b on the semiconductor substrate 4. Across a second major surface (opposite to the first major surface) of the semiconductor substrate 4, an anode electrode (not shown) is formed on which an anode distortion buffer plate (or anode metal plate) 7 and an anode post electrode 8 are sequentially stacked one above the other. The reference numeral 9 is a ring gate electrode which is, at its first surface (bottom surface), in surface to surface contact with the gate electrode 4a on the semiconductor substrate 4. The reference character 10P is a ring-shaped gate terminal made of a metal plate. The inner end portion of an inner plane portion 10PI of the ring-shaped gate terminal 10P is slidably located on a second surface (opposite to the first surface) of the ring gate electrode 9. Further, an elastic body 11 such as a disc or wave spring pushes the ring gate electrode 9 against the gate electrode 4a via a ring insulator 12, in conjunction with the inner end portion of the inner plane portion 10PI of the ring-shaped gate terminal 10P. This establishes an electrical connection between the gate electrode 4a, the ring gate electrode 9, and the ring-shaped gate terminal 10P. The reference numeral 13 is an insulation sheet for insulating the ring gate electrode 9 from the facing cathode distortion buffer plate 5 and the facing cathode post electrode 6. In addition to the inner plane portion 10PI, the ring-shaped gate terminal 10P includes an intermediate or fixed portion 10PF and an outer plane portion 10PO. In a portion of the inner plane portion 10PI which is not in surface to surface contact with the ring gate electrode 9, a bent portion 10Pd is formed, and in the middle of the outer plane portion 10PO, a bent portion 10Pa is formed.

The reference numeral 14 is an insulation cylinder of ceramics which is divided so as to sandwich the intermediate portion 10PF of the ring-shaped gate terminal 10P from above and below. The insulation cylinder 14 further has a protrusion 14a. The fixed portion 10PF of the ring-shaped gate terminal 10P and the insulation cylinder 14 are hermetically fixed to each other by brazing. Further, in a portion of the outer plane portion 10PO of the ring-shaped gate terminal 10P which is spaced slightly inward from the outer end portion, a plurality of mounting holes 10Pb for coupling the ring-shaped gate terminal 10P to the gate drive device 2 are equally spaced along the circumference. Further, an end portion 14b1 of a first L-shaped portion which is protruded above the upper surface of the insulation cylinder 14, bending outwardly, and one end portion of a first ring-shaped flange 15 are hermetically fixed to each other by arc welding. Likely, an end portion 14b2 of a second L-shaped portion which is protruded below the lower surface of the insulation cylinder 14 and one end portion of a second ring-shaped flange 16 are hermetically fixed to each other by arc welding. The other end portions of the first flange 15 and the second flange 16 are fixed to cut portions of the cathode post electrode 6 and the anode post electrode 8, respectively. Thus, the GCT device 1P is enclosed to be kept from the outside. The interior of the device can be replaced by inert gas.

Further, the reference numeral 17 is a plate control electrode made of a ring metal plate which is located to be concentric with the ring-shaped gate terminal 10P. The stack electrode 3 allows the plate control electrode 17 to be in pressure contact with the cathode post electrode 6. Further, like the plate control electrode 17, a plate control gate electrode 18 made of a ring metal plate is located to be concentric with the ring-shaped gate terminal 10P. An inner end portion of the plate control gate electrode 18 is electrically connected to the outer end portion of the outer plane portion 10PO of the ring-shaped gate terminal 10P. This electrical connection is established by the following members 19 and 20: 19 is an insulating sleeve for insulating the ring-shaped gate terminal 10P and the plate control gate electrode 18 from the plate control electrode 17; and 20 is a coupling part including bolts and nuts, for electrically connecting the ring-shaped gate terminal 10P and the plate control gate electrode 18 via the insulating sleeve 19 between the plate control electrode 17 and the plate control gate electrode 18. Each bolt of the coupling part 20 comes through a mounting hole 10Pb, and a mounting hole provided on the plate control gate electrode 18 corresponding to the mounting hole 10P*b*. Thus, the plate control electrode 17 and the plate control gate electrode 18 are directly coupled to the gate drive device 2.

As the material for the ring-shaped gate terminal 10P, an alloy of iron and 42% nickel having a similar thermal expansion characteristic to a thermal expansion coefficient of alumina and relatively high processability and strength has been generally used to obtain high fixing strength of the brazed joint between the ring-shaped gate terminal 10P and the insulation cylinder 14 of alumina (ceramics).

While the development of the aforementioned GCT thyristor has made possible improvements in capacity and speed of a power electronics semiconductor device, larger capacity and higher speed has still been required for the GCT thyristor. This requirement causes new problems to be described below.

(1) First Problem

In a conventional contact pressure type semiconductor device like the GCT thyristor shown in FIG. 4, as previously described, the alloy of iron and 42% nickel has been used as the material for the ring-shaped gate terminal 10P. The reason for selecting this material comes from the following design consideration. That is, to ensure sufficient fixing strength of the brazed joint between the insulation cylinder 14 of alumina and the ring-shaped gate terminal 10P, the ring-shaped gate terminal 10P has to be made of a material having a similar thermal expansion coefficient to alumina (about $6.5 \times 10^{-6}$/° C.). The material meeting this requirement is, for example, metal such as molybdenum and tungsten. However, not practical in terms of cost, such metal cannot be used for the ring-shaped gate terminal 10P. Then, used as an alternative is an alloy of iron and 42% nickel with the thermal expansion coefficient of $4 \times 10^{-6}$ to $13 \times 10^{-6}$/° C. (30° C. to 800° C.) which is approximate to that of alumina. In this case, it has already been verified that the strength at the brazed joint is not affected by an increase in temperature cycle. In this respect as well as in terms of cost and processability, the alloy of iron and 42% nickel has been considered as a suitable material. We can say that such consideration or selection of the material has been just a matter of design in view of cost performance.

The alloy of iron and 42% nickel is, however, a ferromagnetic material having a relatively high maximum permeability of about 40,000. The ferromagnetic property of this alloy has never been taken into consideration when designing either the conventional GTO thyristor or the GCT thyristor shown in FIG. 4. This is because an induction heating function due to electromagnetic induction at the ring-shaped gate terminal 10P has never been considered controversial in controlling low current at an operating frequency of about several hundreds Hz. However, at the operating frequency of 1 kHz or more (e.g., the maximum of 5 to 10 kHz), for example, repetitive phase inversion of gate current during a short period of time causes fluctuations in magnetic state. As a result, magnetic and electric energy stored as an iron loss in the ring-shaped gate terminal 10P is converted into thermal energy. This increases the temperature of the ring-shaped gate terminal 10P. The generation of heat in the ring-shaped gate terminal 10P is transmitted via the ring gate electrode 9 to the semiconductor substrate 4, thereby causing an increase in the temperature and the temperature difference across the surface of the semiconductor substrate 4. This brings about changes in the electrical characteristics of each segment in the semiconductor substrate 4.

Through an experiment using a copper plate, instead of a semiconductor substrate, as an element, the inventors of the present invention have found that the temperature of the ring-shaped gate terminal 10P is increased by the induction heating function. More specifically, we have found the increase in the temperature at each measuring point, by passing current of about 1 kA between the anode and the cathode of the element at the operating frequency of 1 to 10 kHz for about five minutes and measuring the temperature of an anode copper block. The data obtained by this experiment is shown in FIG. 5. In the drawing, the symbols ACu1 to ACu4, AF1 to AF4, and G1 to G4 indicate observation points (installed positions of thermocouples) shown in the plan view of FIG. 6. It can be seen from FIG. 5 that the temperature increase ΔT goes almost linearly with the operating frequency (from 1 to 10 kHz). While the experimental data in FIG. 5 directly shows the likelihood that the temperature of the ring-shaped gate terminal 10P is increased by the induction heating function, we also consider that the likelihood of an increase in the temperature of the semiconductor substrate can be inferred from this data.

Then, there arises a necessity of cooling down such an increase in the temperature. The structural restrictions due to the shape and location of each element shown in FIG. 4, however, makes it difficult to directly cool down the ring-shaped gate terminal 10P.

Therefore, the selection of the material for the ring-shaped gate terminal becomes important, in terms of prevention of the induction heating function due to the electromagnetic induction, and also in terms of maintenance of the fixing strength at the brazed joint between the ring-shaped gate terminal and the insulation to the same extent as the conventional device.

(2) Second Problem

Further, the increase in the capacity of the GCT device with the increase in the maximum cut-off current brings about an increase in the number of segments to be concentrically connected in parallel with each other in the semiconductor substrate. This inevitably encourages an increase in the diameter of a package as well as of the semiconductor substrate. As the outer diameters of the semiconductor substrate and the package increase, a greater distortion which cannot be ignored remains at the brazed point between the ring-shaped gate terminal 10P and the insulation cylinder 14, and in the inner plane portion 10PI. Such a residual distortion acts as a thermal stress on the outer plane portion 10PO of the ring-shaped gate terminal 10P during operation. This very possibly causes plastic deformation of the outer plane portion 10PO.

Indeed the outer plane portion 10PO and the inner plane portion 10PI of the ring-shaped gate terminal 10P have the bent portions 10P*a* and 10P*d* to reduce the concentration of external stresses on the fixed portion 10PF of the ring-shaped gate terminal 10P fixed to the insulation cylinder 14. However, when the outer diameter of the ring-shaped gate terminal 10P exceeds 200 mm, for example, those bent portions 10P*a* and 10P*d* are insufficient to reduce the isotropic thermal stress to be imposed on a portion ranging from the inner plane portion 10PI or the fixed portion 10PF fixed to the insulation cylinder 14 to the outer plane portion 10PO. This may cause the plastic deformation of the outer plane portion 10PO, resulting in a contact failure due to the mechanical stress at the junction (feeding point) between the mounting hole 10P*b* and the coupling part 20 for coupling the GCI device 1P to the gate drive device 2. Accordingly, the isotropic supply of gate current is very possibly prevented. Further, the thermal stress left at the time of brazing the ring-shaped gate terminal 10P and the insulation cylinder 14 may cause a swell in the shapes of the ring-shaped gate terminal 10P and the insulation cylinder 14, thereby making it difficult to produce an integrated part consisting of the ring-shaped gate terminal 10P and the insulation cylinder 14.

Therefore, it becomes necessary to previously prevent or suppress these problems.

SUMMARY OF THE INVENTION

A first aspect of the present invention is directed to a pressure contact pressure type semiconductor device, comprising: a disciform semiconductor substrate with a ring-shaped gate electrode formed thereon; a ring gate electrode in contact with the gate electrode; a gate terminal having a first end portion in contact with the ring gate electrode, and a second end portion extending to the outside; and an insulation cylinder fixed to an intermediate portion of the gate terminal outside the first and second end portions so as to sandwich the intermediate portion from above and below, and containing all of the semiconductor substrate, the ring gate electrode, and a portion of the gate terminal which ranges from the first end portion to the intermediate portion. A material for the gate terminal is a magnetic material with the maximum permeability of 15,000 or less in the CGS Gaussian system of units.

According to a second aspect of the present invention, in the contact pressure type semiconductor device of the first aspect, the gate terminal is a ring-shaped gate terminal. The ring-shaped gate terminal comprises an inner plane portion, the intermediate portion connected to the inner plane portion, and an outer plane portion connected to the intermediate portion. An inner end portion of the inner plane portion corresponds to the first end portion, while an outer end portion of the outer plane portion corresponding to the second end portion.

According to a third aspect of the present invention, in the contact pressure type semiconductor device of the second aspect, the material for the ring-shaped gate terminal is a non-magnetic material.

According to a fourth aspect of the present invention, in the contact pressure type semiconductor device of the second aspect, the material for the ring-shaped gate terminal is determined based on a strength to fix the ring-shaped gate terminal to the insulation cylinder.

According to a fifth aspect of the present invention, in the contact pressure type semiconductor device of the fourth aspect, the ring-shaped gate terminal is metal with a thermal expansion coefficient of $0 \times 10^{-6}/°$ C. to $13 \times 10^{-6}/°$ C. at a temperature between 30° C. to 800° C.

According to a sixth aspect of the present invention, in the contact pressure type semiconductor device of the fourth aspect, the ring-shaped gate terminal is metal with Young's modulus of 60 to 210 GPa.

According to a seventh aspect of the present invention, in the contact pressure type semiconductor device of the second aspect, the ring-shaped gate terminal is metal containing at least copper as its main component.

According to an eighth aspect of the present invention, in the contact pressure type semiconductor device of the second aspect, the ring-shaped gate terminal is metal containing at least aluminum as its main component.

According to a ninth aspect of the present invention, in the contact pressure type semiconductor device of the second aspect, the ring-shaped gate terminal is metal containing at least molybdenum as its main component.

According to a tenth aspect of the present invention, in the contact pressure type semiconductor device of the second aspect, the ring-shaped gate terminal is metal containing at least iron as its main component.

According to an eleventh aspect of the present invention, in the contact pressure type semiconductor device of the second aspect, the ring-shaped gate terminal is metal containing at least nickel as its main component.

According to a twelfth aspect of the present invention, in the contact pressure type semiconductor device of the second aspect, the ring-shaped gate terminal is metal containing at least cobalt as its main component.

According to a thirteenth aspect of the present invention, in the contact pressure type semiconductor device of the second aspect, the ring-shaped gate terminal is metal containing at least chromium as its main component.

According to a fourteenth aspect of the present invention, in the contact pressure type semiconductor device of the second aspect, the ring-shaped gate terminal is metal containing at least manganese as its main component.

According to a fifteenth aspect of the present invention, in the contact pressure type semiconductor device of the second aspect, the ring-shaped gate terminal is metal containing at least titanium as its main component.

According to a sixteenth aspect of the present invention, the contact pressure type semiconductor device of the second aspect further comprises a slit provided in the outer plane portion of the ring-shaped gate terminal, extending diametrically.

A seventeenth aspect of the present invention is directed to a contact pressure type semiconductor device comprising: (a) a disciform semiconductor substrate with a ring-shaped gate electrode formed thereon; (b) a ring gate electrode in contact with the gate electrode; (c) gate terminal means for forming a path for gate current and preventing induction heating function due to electromagnetic induction, the gate terminal means having a first end portion in contact with the ring gate electrode, and a second end portion extending to the outside; and (d) an insulation cylinder fixed to an intermediate portion of the gate terminal means outside the first and second end portions so as to sandwich the intermediate portion from above and below, and containing all of the semiconductor substrate, the ring gate electrode, and a portion of the gate terminal means which ranges from the first end portion to the intermediate portion.

An eighteenth aspect of the present invention is directed to a ring-shaped gate terminal for a contact pressure type semiconductor device. The ring-shaped gate terminal is made of a magnetic material with the maximum permeability of 15,000 or less in the CGS Gaussian system of units.

According to a nineteenth aspect of the present invention, the ring-shaped gate terminal of the eighteenth aspect comprises a slit provided in the outer end portion, extending diametrically.

According to the first to fifteenth, seventeenth and eighteenth aspects, the contact pressure type semiconductor device which controls large current at a relatively high operating frequency of 1 kHz or more can prevent or substantially reduce the induction heating function due to the electromagnetic induction at the ring-shaped gate terminal.

According to the fourth to sixth aspects, the fixing strength of the brazed joint between the ring-shaped gate terminal and the insulation cylinder is large enough for practical use. Besides, the induction heating function due to the electromagnetic induction can be prevented or substantially reduced.

According to the sixteenth and nineteenth aspects, it is possible to prevent or suppress the plastic deformation of the outer plane portion of the ring-shaped gate terminal due to the thermal stress.

An object of the present invention is to resolve the first conventional problem: to prevent or substantially reduce the induction heating function due to the electromagnetic induction at the ring-shaped gate terminal.

Another object of the present invention is to resolve the second conventional problem: to prevent or suppress the plastic deformation of the outer plane portion of the ring-shaped gate terminal due to the thermal stress during operation which is left at the time of brazing.

These and other objects, features, aspects and advantages of the present invention will become more apparent from the following detailed description of the present invention when taken in conjunction with the accompanying drawings.

DESCRIPTION OF THE PREFERRED EMBODIMENTS

1. FIRST PREFERRED EMBODIMENTS

Figure 1:
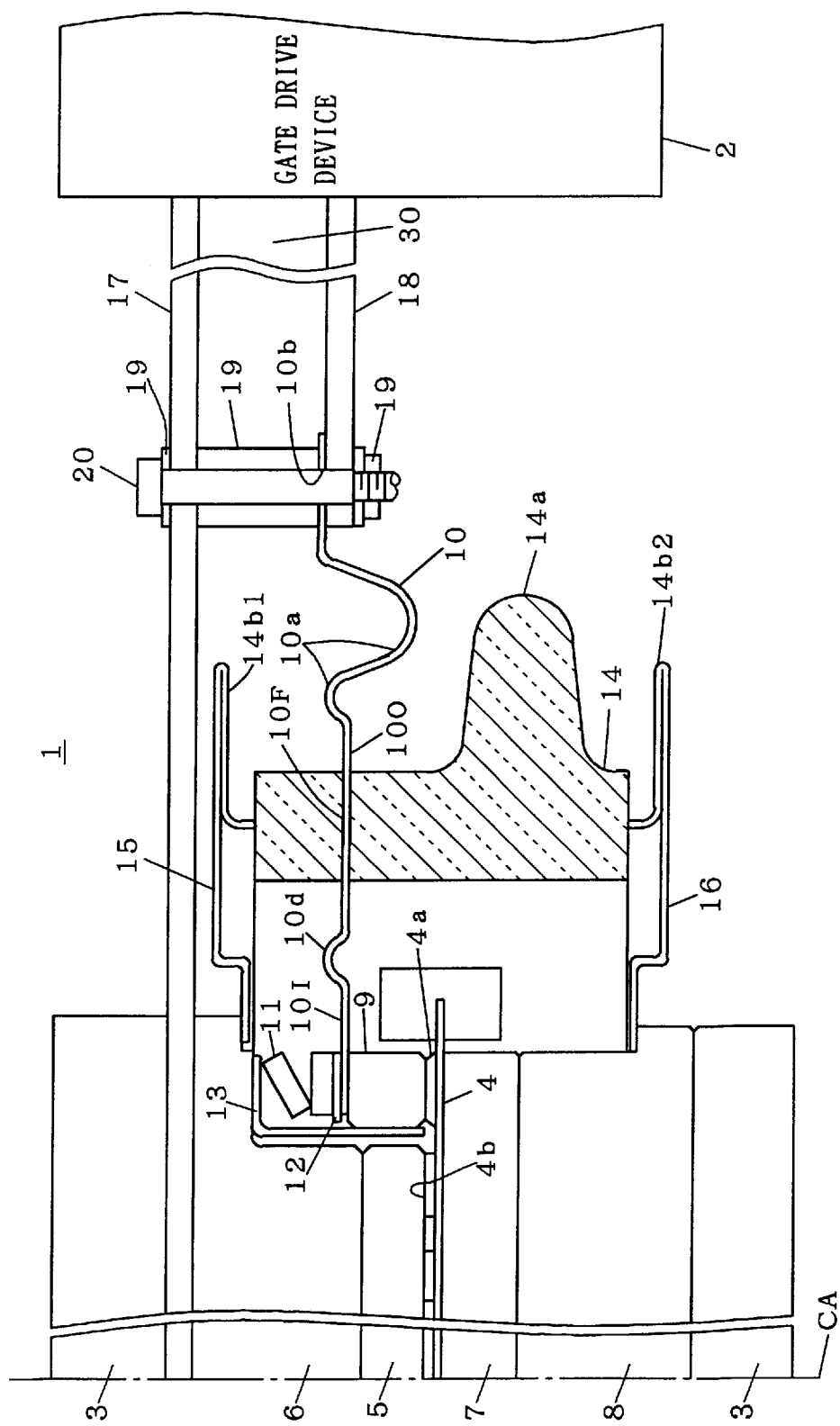
FIG. 1 is a longitudinal cross-sectional view of the structure of a GCT device according to a first preferred embodiment of the present invention.

FIG. 1 is a longitudinal cross-sectional view showing the structure of a GCT device 1, including a gate driver, as an example of a contact pressure type semiconductor device according to a first preferred embodiment. Since the GCT device 1 has a structure bilaterally symmetrical on a central axis CA, only one side of the structure is shown in FIG. 1.

Each reference numeral or character in FIG. 1 indicates each element as follows: 2 is a gate drive device for controlling the GCT device 1; 3 is a stack electrode for pressurizing the GCT device 1 and drawing current; and 4 is a semiconductor substrate (wafer) having a pnpn structure in which several thousands of segments are concentrically located in parallel with each other. On the peripheral portion of a first major surface or front surface of the semiconductor substrate 4, a ring-shaped gate electrode 4a of aluminum is formed in electrical contact with a gate electrode region formed in the outermost peripheral portion of the substrate. On the inner side of that first major surface outside the ring-shaped gate electrode 4a, a plurality of cathode electrodes 4b are concentrically formed. The reference numerals 5 and 6 are a cathode distortion buffer plate (or cathode metal plate) and a cathode post electrode, respectively, which are sequentially stacked one above the other on the cathode electrodes 4b on the semiconductor substrate 4. Across a second major surface or back surface (opposite to the first major surface) of the semiconductor substrate 4, an anode electrode (not shown) is formed on which an anode distortion buffer plate (or anode metal plate) 7 and an anode post electrode 8 are sequentially stacked one above the other. The reference numeral 9 is a ring gate electrode which is, at its first surface (bottom surface), in surface to surface contact with the gate electrode 4a on the semiconductor substrate 4; and the reference numeral 10 is a ring-shaped gate terminal made of a metal plate. The inner end portion of an inner plane portion 10I of the ring-shaped gate terminal 10 is slidably located on a second surface (opposite to the first surface) of the ring gate electrode 9. Further, an elastic body 11 such as a disc or wave spring pushes the ring gate electrode 9 against the gate electrode 4a via a ring-shaped insulator 12, in conjunction with the inner end portion of the inner plane portion 10I of the ring-shaped gate terminal 10. This establishes an electrical connection between the gate electrode 4a, the ring gate electrode 9, and the ring-shaped gate terminal 10. The reference numeral 13 is an insulation sheet for insulating the ring gate electrode 9 from the facing cathode distortion buffer plate 5 and the facing cathode post electrode 6. In addition to the inner plane portion 10I, the ring-shaped gate terminal 10 includes an intermediate or fixed portion 10F and an outer plane portion 10O. In a portion of the inner plane portion 10I which is not in surface to surface contact with the ring gate electrode 9, a bent portion 10d is formed, and in the middle of the outer plane portion 10O, a bent portion 10a is formed.

Figure 2:
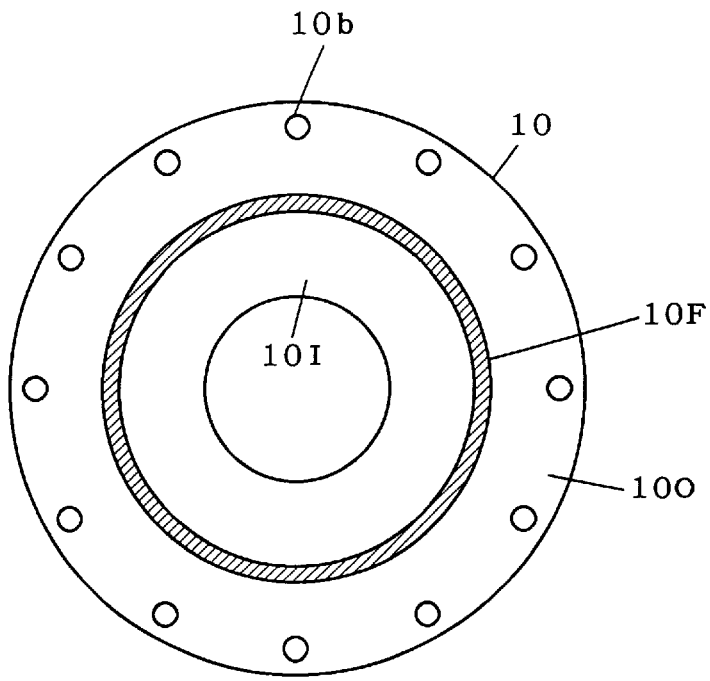
FIG. 2 is a top view of a ring-shaped gate terminal in the GCT device according to the first preferred embodiment of the present invention.

The reference numeral 14 is an insulation cylinder of ceramics (e.g., alumina) which is divided so as to sandwich the intermediate portion 10F of the ring-shaped gate terminal 10 from above and below. The insulation cylinder 14 further has a protrusion 14a at its outer peripheral side surface portion, and contains the major parts of the elements 4, 5, 7, 9, 10, 11, and 12. The fixed portion 10F of the ring-shaped gate terminal 10 and the insulation cylinder 14 are hermetically fixed to each other by brazing. Further, in a portion of the outer plane portion 10O which is spaced slightly inward from the outer end portion, a plurality of mounting holes 10b for coupling the ring-shaped gate terminal 10 to the gate drive device 2 are equally spaced along the circumference. This part is shown in FIG. 2 which is a top view of the ring-shaped gate terminal 10. Further, an end portion 14b1 of a first L-shaped portion which is protruded above the upper surface of the insulation cylinder 14, bending outwardly, and one end portion of a first ring-shaped flange 15 are hermetically fixed to each other by arc welding. Likely, an end portion 14b2 of a second L-shaped portion which is protruded below the lower surface of the insulation cylinder 14, and one end portion of a second ring-shaped flange 16 are hermetically fixed to each other by arc welding. The other end portions of the first flange 15 and the second flange 16 are fixed to cut portions of the cathode post electrode 6 and the anode post electrode 8, respectively. Thus, the GCT device 1 is enclosed to be kept from the outside. The interior of the device can be replaced by inert gas.

Further, the reference numeral 17 is a plate control electrode of a ring-shaped metal plate which is located to be concentric with the ring-shaped gate terminal 10. The stack electrode 3 allows the plate control electrode 17 to be in pressure contact with the cathode post electrode 6. Further, like the plate control electrode 17, a plate control gate electrode 18 made of a ring-shaped metal plate is located to be concentric with the ring-shaped gate terminal 10. An inner end portion of the plate control gate electrode 18 is electrically connected to the outer end portion of the outer plane portion 10O of the ring-shaped gate terminal 10. This electrical connection is realized by the following members 19 and 20: 19 is an insulating sleeve for insulating the ring-shaped gate terminal 10 and the plate control gate electrode 18 from the plate control electrode 17; and 20 is a coupling part including bolts and nuts, for electrically connecting the ring-shaped gate terminal 10 and the plate control gate electrode 18 via the insulating sleeve 19 between the plate control electrode 17 and the plate control gate electrode 18. Each bolt of the coupling part 20 comes through a mounting hole 10b and a mounting hole provided on the plate control gate electrode 18 corresponding to the mounting hole 10b. Thus, the plate control electrode 17 and the plate control gate electrode 18 are directly coupled to the gate drive device 2. The reference numeral 30 is an insulating substrate.

Figure 4:
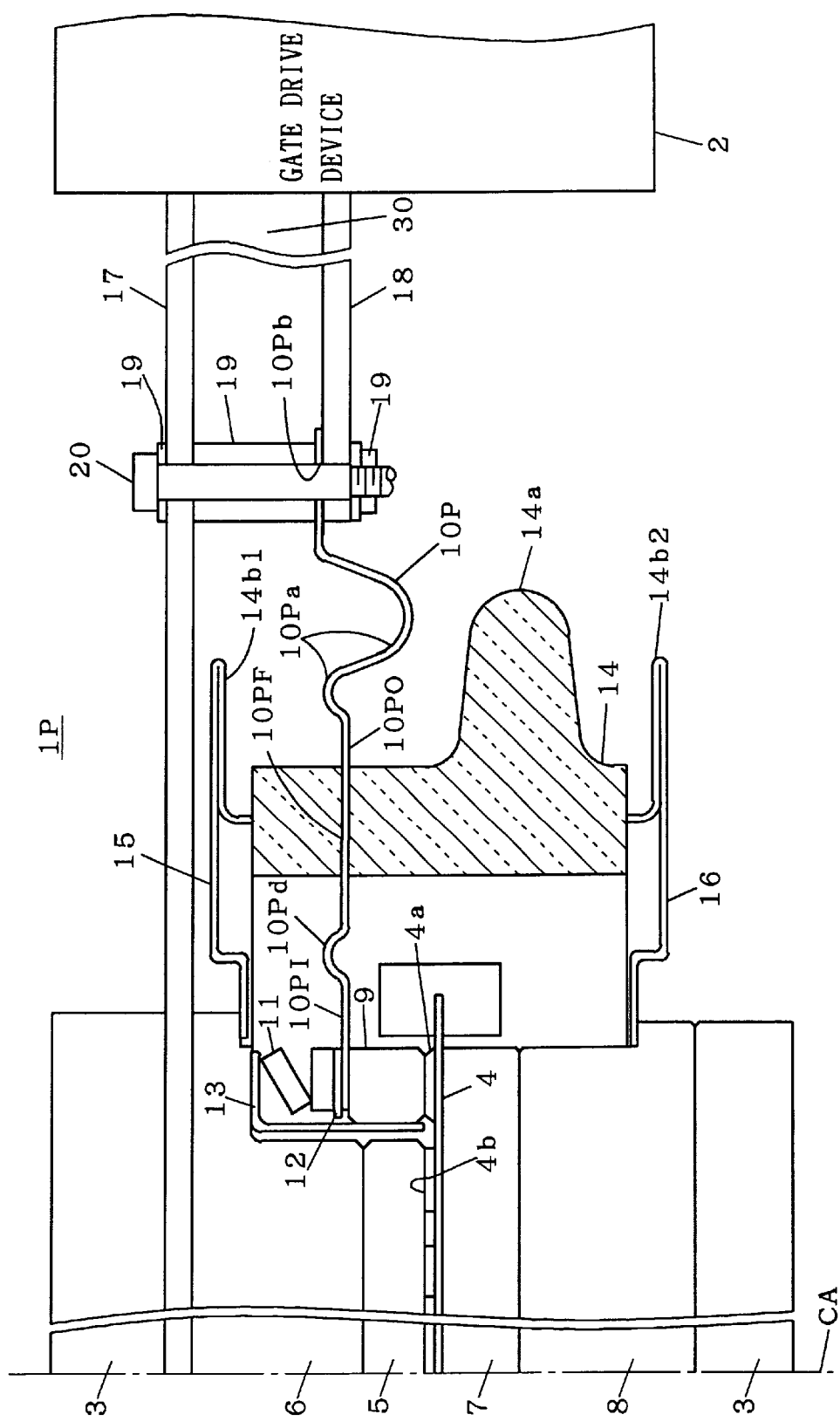
FIG. 4 is a cross-sectional view of the structure of a conventional GCT device.
Figure 5:
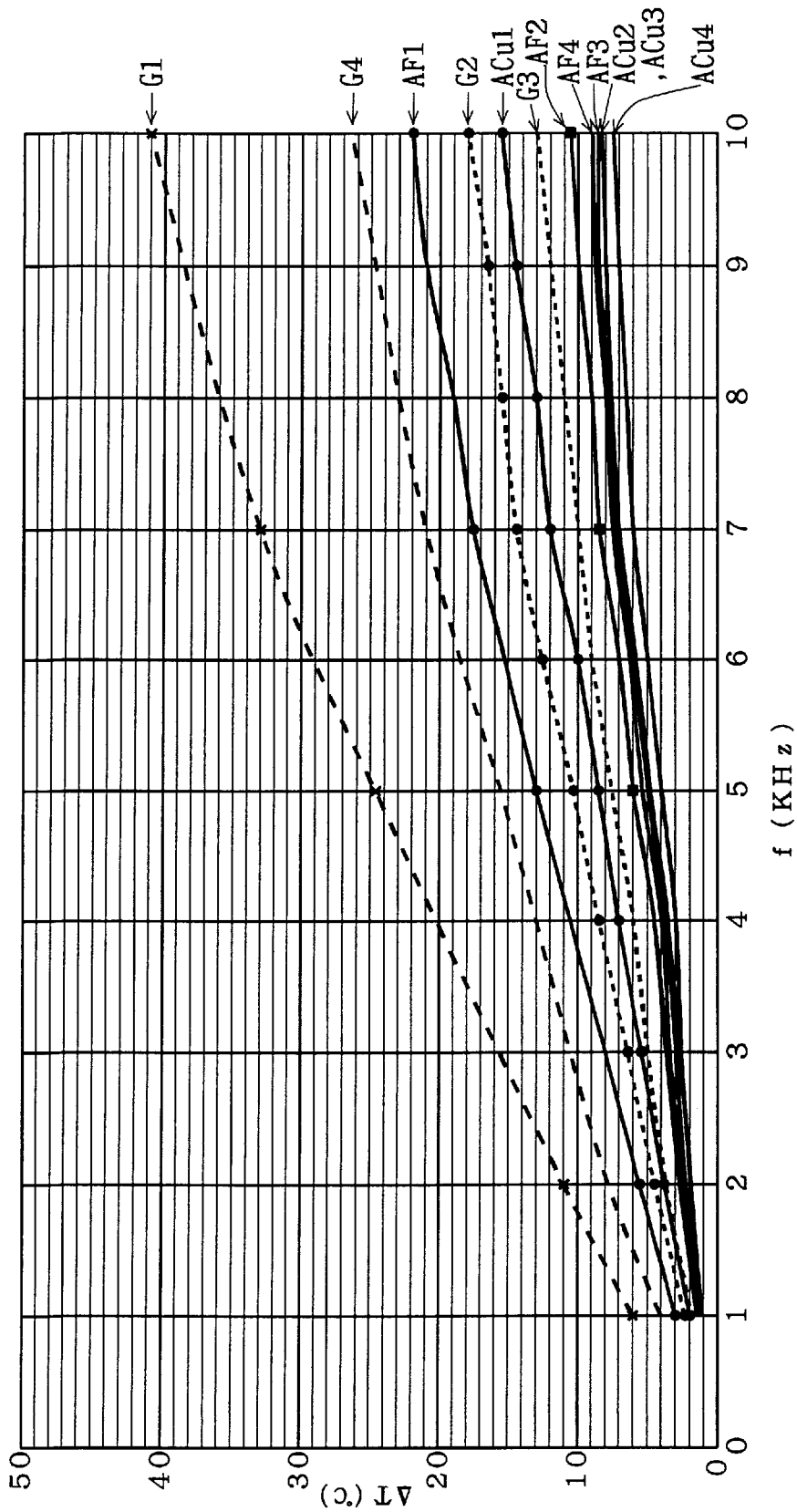
FIG. 5 is a graph illustrating conventional problems.
Figure 6:
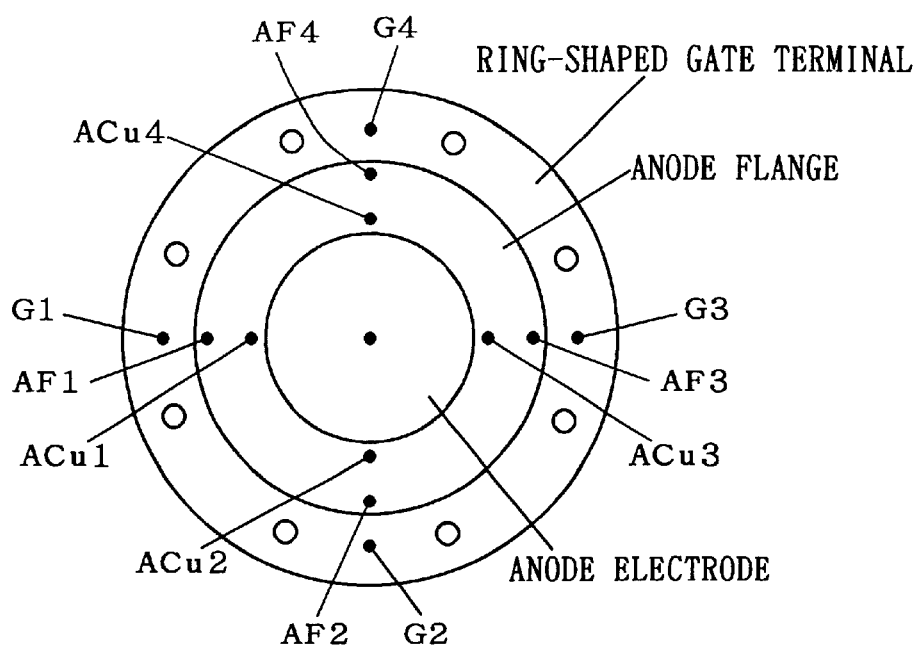
FIG. 6 is a plane view showing measuring points.

The difference between the GCT device 1 in FIG. 1 and the GCT device 1P in FIG. 4 is a material for the ring-shaped gate terminal. More specifically, the conventional GCT device has used an alloy containing iron and 42% nickel as a material for the ring-shaped gate terminal, since the device has given its attention only to a material having an affinity for the thermal expansion coefficient of a material for the insulation cylinder. That is, a relatively high ferromagnetic material has been used for the ring-shaped gate terminal. The inventors of the present invention have found that this results in the induction heating function due to the electromagnetic induction at the ring-shaped gate material at a relatively high operating frequency. Thus, in the present GCT device 1, an non ferromagnetic material, namely, a feeble magnetic material which will be defined later, is used for the ring-shaped gate terminal 10. This greatly reduces the magnetism of the ring-shaped gate terminal 10 which is to be the cause of the induction heating function. Thus, even if the GCT device 1 is operated at the operating frequency of 1 kH or more, fluctuations in the magnetic state of the ring-shaped gate terminal 10 can be sufficiently suppressed or prevented. Accordingly, without providing a special cooling device within the GCT device 1, it becomes possible to sufficiently reduce or perfectly prevent increases in the temperature of the ring-shaped gate terminal 10 and the temperature difference across the surface of the semiconductor substrate 4. In such case, the material for the ring-shaped gate terminal 10 is preferably a magnetic material with the maximum permeability of 15,000 or less in the CGS Gaussian system of units, which will be described later as examples. Such magnetic materials include: (i) a non-magnetic material; (ii) a part of ferromagnetic materials; and (iii) a part of antiferromagnetic materials. The magnetic material with the maximum permeability of 15, 000 or less in the CGS Gaussian system of units is hereinafter referred to as a "feeble magnetic material." Here, the "non-magnetic material" includes ① a material magnetized by an external magnetic field and ② a ferromagnetic material which is to be a non-magnetic material at a Curie temperature (or Neel temperature for an antiferromagnetic material) or more. In a broad sense, the "non-magnetic material" includes a "paramagnetic material" and a "diamagnetic material."

Moreover, like the conventional GCT device 1P, it is necessary in the present GCT device 1 to secure the fixing strength of the brazed joint between the ring-shaped gate terminal 10 and the insolution cylinder 14, to a sufficient level for practical use. A sufficient level of fixing strength can be obtained by making the ring-shaped gate terminal 10 of a feeble magnetic material having a thermal expansion coefficient that is similar or approximate to that of the alloy of iron and 42% nickel used for the conventional ring-shaped gate terminal 10P. In the present GCT device 1, a feeble magnetic material with a thermal expansion coefficient $\alpha$ of $0 \times 10^{-6}/°$ C. to $13 \times 10^{-6}/°$ C. (30–800° C.) is used for the ring-shaped gate material 10. It has also been confirmed that copper or aluminum can be a material for the ring-shaped gate terminal 10 because its ductility brings about the same level of fixing strength as the alloy of iron and 42% nickel used for the ring-shaped gate terminal 10P in the conventional GCT device 1P. Such metal with ductility has Young's modulus E of 60 to 210 GPa. Thus, as an alternative to the feeble magnetic material having the aforementioned thermal expansion coefficient, the present GCT device 1 can also use a feeble magnetic material with Young's modulus E of 60 to 210 GPa for the ring-shaped gate material 10. The use of the feeble magnetic materials with such thermal expansion coefficient $\alpha$ or Young's modulus E reduces the thermal stress while maintaining the fixing strength at the same level as the conventional GCT device.

There are various examples of the material for the ring-shaped gate terminal 10 meeting the aforementioned conditions. In the following, we will give several typical examples.

For the purpose of improving the characteristics such as magnetism, joining, and processability, minor amounts of following elements can be added to or mixed as an impurity with each material component (main component): titanium (Ti); silicon (Si); manganese (Mn); carbon (C); nickel (Ni); iron (Fe); chromium (Cr); cobalt (Co); niobium (Nb); vanadium (V); nitrogen (N); calcium (Ca); phosphorus (P); magnesium (Mg); tin (Sn); or sulfur (S). Further, each main component to be described later can be coated or plated with soft metal such as Ni, Al, Au, Ag, or Cu.

1-1. FIRST EXAMPLE

In a first example, the material for the ring-shaped gate terminal 10 is metal containing copper as its main component. In this case, oxygen free copper with Young's modulus of approximately 126 GPa is used for the ring-shaped gate terminal 10 in FIG. 1.

Accordingly, the ring-shaped gate terminal 10 is made of a non-magnetic material. This allows a substantial reduction in the magnetism of the ring-shaped gate terminal 10 as compared with the conventional alloy of iron and 42% nickel.

1-2. SECOND EXAMPLE

In a second example, the material for the ring-shaped gate terminal 10 is molybdenum with a thermal expansion coefficient $\alpha$ ($\times 10^{-6}/°C$.) of approximately 4.9.

Accordingly, the ring-shaped gate terminal 10 is made of a feeble magnetic material. This allows a substantial reduction in the magnetism of the ring-shaped gate terminal 10 as compared with the conventional alloy of iron and 42% nickel.

1-3. THIRD EXAMPLE

In a third example, the material for the ring-shaped gate terminal 10 is another metal containing copper as its main component. In this case, brass with Young's modulus E of about 98 GPa is used for the ring-shaped gate terminal 10 in FIG. 1.

Accordingly, the ring-shaped gate terminal 10 is made of a feeble magnetic material. This allows a substantial reduction in the magnetism of the ring-shaped gate terminal 10 as compared with the conventional alloy of iron and 42% nickel.

1-4. FOURTH EXAMPLE

In a fourth example, the material for the ring-shaped gate terminal 10 is metal containing aluminum as its main component. In this case, duralumin with Young's modulus E of approximately 69 GPa is used for the ring-shaped gate terminal 10 in FIG. 1.

Accordingly, the ring-shaped gate terminal 10 is made of a feeble magnetic material. This allows a substantial reduction in the magnetism of the ring-shaped gate material 10 as compared with the conventional alloy of iron and 42% nickel.

1-5. FIFTH EXAMPLE

In a fifth example, the material for the ring-shaped gate terminal 10 is metal containing iron as its main component. In this case, an alloy of iron and 18.5% chromium is used for the ring-shaped gate terminal 10 in FIG. 1. Thus, the ring-shaped gate terminal 10 is made of a feeble magnetic material with the maximum permeability of about 4,500 (in the CGS Gaussian system of units). This allows a substantial reduction in the magnetism of the ring-shaped gate terminal 10 as compared with the conventional alloy of iron and 42% nickel. The alloy of iron and chromium in this case is a kind of stainless steel which will be described later. Thus, it can be also said that the material is metal containing iron and chromium as its main components. The thermal expansion coefficient $\alpha$ of the alloy of iron and chromium in this case is approximately $10.9 \times 10^{-6}/°$ C.

1-6. SIXTH EXAMPLE

In a sixth example, the material for the ring-shaped gate terminal 10 is another metal containing iron as its main component. In this case, stainless steel is used for the ring-shaped gate terminal 10 in FIG. 1. The stainless steel is an alloy of iron doped with 11% or more chromium. Thus, it can be also said that the material is metal containing iron and chromium as its main components. Especially, austenitic stainless steel containing iron, 15–20% chromium, and 8–25% nickel (e.g., SUS316) is a non-magnetic material with Young's modulus E of approximately 197 GPa.

Accordingly, the ring-shaped gate material 10 is made of a feeble magnetic material or a non-magnetic material. This allows a substantial reduction in the magnetism of the ring-shaped gate material 10 as compared with the conventional alloy of iron and 42% nickel.

1-7. SEVENTH EXAMPLE

In a seventh example, the material for the ring-shaped gate terminal 10 is further another metal containing iron as its main component. In this case, an alloy (kovar) of iron, 29% nickel, and 17% cobalt is used for the ring-shaped gate terminal 10 in FIG. 1. The average thermal expansion coefficient $\alpha$ ($\times 10^{-6}/°$ C.) of kovar is 5.3 at 30° C.–200° C., 5.0 at 30° C., 4.8 at 30° C.–400° C., 6.3 at 30° C.–500° C., or 11.0 at 30° C.–800° C.

It can be also said that kovar is metal containing iron, nickel, and cobalt as its main components.

Accordingly, the ring-shaped gate material 10 is made of a feeble magnetic material with the maximum permeability of about 10,000 (in the CGS Gaussian system of units). This allows a substantial reduction in the magnetism of the ring-shaped gate material 10 as compared with the conventional alloy of iron and 42% nickel.

1-8. EIGHTH EXAMPLE

In an eighth example, the material for the ring-shaped gate terminal 10 is clad metal containing kovar as its main component. In this case, metal having a three-layer structure (CKC clad material where C is copper; and K is kovar) in which kovar is cladded with copper from above and below is used for the ring-shaped gate terminal 10 in FIG. 1. As the plate-thickness ratio of copper to kovar increases, the maximum permeability of clad metal tends to decrease and the thermal expansion coefficient thereof tends to increase. Thus, the desired material characteristics satisfying the conditions of the thermal expansion coefficient (from $0 \times 10^{-6}$ to $13 \times 10^{-6}$ at 30° C.–800° C.) can be obtained by appropriately changing the plate-thickness ratio. The maximum permeability of clad metal, however, never exceeds 15,000 in the CGS Gaussian system of units. Thus, the thermal expansion coefficient $\alpha$ of a CKC clad material with the plate-thickness ratio of 1:8:1 is, for example, $5.0 \times 10^{-6}/°$ C.

In a broad sense, "clad metal" belongs to "metal". Thus, it can be also said that the CKC clad material in this example is metal containing kovar or kovar and copper as its main component(s).

Further, it is also possible to use clad metal with kovar cladded with cupronickel from above and below.

Further, it is also possible to use a KCK clad material with copper cladded with kovar. In such case, also, the thermal expansion coefficient can be maintained within the aforementioned range by appropriately controlling the plate-thickness ratio as in the case of the CKC clad material.

By the use of such clad metal, the ring-shaped gate terminal 10 is made of a feeble magnetic metal. This allows a substantial reduction in the magnetism of the ring-shaped gate terminal 10 as compared with the conventional ferromagnetic alloy of iron and 42% nickel.

1-9. MODIFICATIONS (1) The material for the ring-shaped gate terminal 10 can be metal containing at least cobalt as its main component. One example is an alloy of 40% cobalt, 15% nickel, 20% chromium, 7% molybdenum, and iron.

(2) The material for the ring-shaped gate terminal 10 can be metal containing at least chromium as its main component. alloy of 38% nickel, 18% chromium, and iron; and ③ an alloy of chromium and 5.5% iron. These alloys are all non-magnetic materials. Thus, they can be an example of the following (3) or an example of metal containing iron as its main component.

(3) The material for the ring-shaped gate terminal 10 can be metal containing at least nickel as its main component.

Examples include: ① a non-magnetic alloy of nickel and 20% chromium (or metal containing nickel and chromium as its main component); ② a non-magnetic alloy of copper and 55% nickel (or metal containing copper and nickel as its main component); and ③ non-magnetic cupronickel (or an alloy of copper and 30% nickel, or metal containing copper and nickel as its main component, or metal containing copper as its main component).

(4) The material for the ring-shaped gate terminal 10 can be clad metal containing aluminum as its main component.

Examples include: ① metal having a three-layer structure in which aluminum is cladded with austenite stainless steel from above and below; and ② metal having a three-layer structure in which austenite stainless steel is cladded with aluminum from above and below.

(5) The material for the ring-shaped gate terminal 10 can be clad metal containing copper as its main component.

Examples include: ① metal with copper cladded with austenite stainless steel (e.g. SUS304) from above and below; and ② metal with copper cladded with cupronickel from above and below. The composition of each clad metal ①, ② can be of course inverted.

(6) The material for the ring-shaped gate terminal 10 can be metal containing, as its main components, copper and aluminum, or copper and molybdenum, or aluminum and molybdenum, or copper, aluminum and molybdenum. One example is an alloy of copper and 30% molybdenum.

Further, it is also possible to use metal containing at least molybdenum as its main component. One example is an alloy of molybdenum and 30% copper.

(7) The material for the ring-shaped gate terminal 10 can be metal containing, as its main components, at least two of the followings: iron, nickel, cobalt, chromium, manganese, and molybdenum. Some of such metal have a thermal expansion coefficient of almost $0 \times 10^{-6}/°C$. at room temperature. As an example of a non-magnetic material, the material in the modification (2)—③ is given.

(8) The material for the ring-shaped gate terminal 10 can be metal containing manganese as its main component. Examples include: ① an alloy of 22% manganese, 13% chromium, and iron; ② an alloy of 25% manganese, 5% chromium, and iron; and ③ an alloy of 32% manganese, 7% chromium, and iron.

(9) The material for the ring-shaped gate terminal 10 can be metal containing titanium as its main component. Examples include: ① titanium as one unit; ② an alloy of 5% aluminum, 2.5% tin, and titanium; and ③ an alloy of 6% aluminum, 4% vanadium, and titanium.

1-10. SUMMARY

Out of the aforementioned examples, the metal in the first example, the austenite stainless steel in the sixth example, and the materials in the modifications (1) to (5), (8), and (9) belong to non-magnetic materials. Further, the materials in the third, fourth, sixth, and eighth examples and the modifications (6) and (7) can also be nonmagnetic materials by controlling the components therein or the plate-thickness ratio. In either case, the composition of each alloy can be changed from the examples.

As described so far, the contact pressure type semiconductor device 1, which controls large amounts of current at relatively high operating frequency , uses the feeble magnetic metal with the thermal expansion coefficient of $0 \times 10^{-6}/°C$. to $13 \times 10^{-6}/°C$. (at 30° C.–800° C.) or with Young's modulus of 60 to 210 GPa as the material for the ring-shaped gate terminal 10 in FIG. 1. This makes it possible (i) to obtain large fixing strength of the brazed joint between the ring-shaped gate terminal 10 and the insulation cylinder 14 of ceramics, and also (ii) to prevent or substantially reduce the induction heating function due to the electromagnetic induction.

2. SECOND PREFERRED EMBODIMENT

A GCT device given as an example of a contact pressure type semiconductor device according to a second preferred embodiment can resolve the aforementioned conventional problem (2). This device is almost similar in structure to the GCT device of the first preferred embodiment, but different only in the ring-shaped gate terminal. The material for the ring-shaped terminal is, however, not considered in this preferred embodiment. That is, the material for the ring-shaped gate terminal can be either a nonferromagnetic material as in the GCT device 1 in FIG. 1 or a ferromagnetic material as in the GCT device in FIG. 4. Of course, the former is more preferable than the latter because the conventional problem (1) can be also resolved. In the following description, attention is only given to the structure of the ring-shaped gate terminal.

Figure 3:
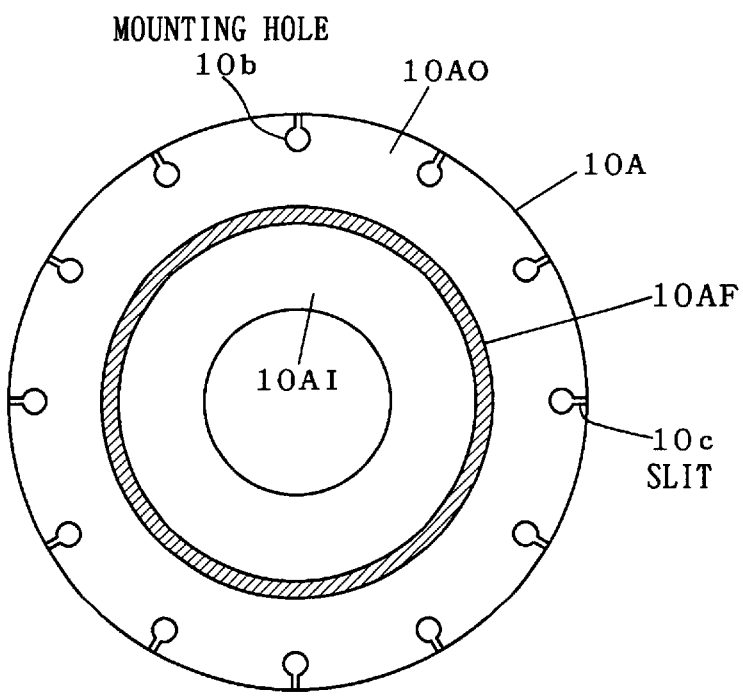
FIG. 3 is a top view of a ring-shaped gate terminal in a GCT device according to a second preferred embodiment of the present invention.

FIG. 3 is a plane view of a ring-shaped gate terminal 10A extracted from a GCT device corresponding to the GCT device 1 in FIG. 1. As shown in FIG. 3, in an outer plane portion 10AO of the ring-shaped gate terminal 10A, a plurality of slits are provided, extending from the outer end portion in a direction of diameter or the central axis. More specifically, in the outer plane portion 10AO, slits 10c are formed from the outer end portion to the corresponding mounting holes 10b.

In such a structure, the slits 10c can absorb distortion due to the residual thermal stress imposed on the outer plane portion 10AO of the ring-shaped gate terminal 10A during operation (especially from expansion to shrinking). This prevents or suppresses plastic deformation of the outer plane portion 10AO, thereby improving contact and slide between the ring-shaped gate terminal 10A and the coupling part 20 which form a junction between the gate drive device 2 and the ring-shaped gate terminal 10A (see FIG. 1).

3. ADDITIONAL REMARK

In the first and the second preferred embodiments, a feeble magnetic material is used as the material for the ring-shaped gate terminal to prevent the induction heating function due to the electromagnetic induction. Also, a lead-shaped gate terminal can be made of such a feeble magnetic material (with the maximum permeability of 15,000 or less in the CGS Gaussian system of units.)

Further the contact pressure type semiconductor devices (GCT) according to the first and second preferred embodiments can be used for various application devices. For example, the GCT thyristor can be used as a large-power element in a power application device such as a reactive power generator (static var generator), a back-to-back device, and a frequency converter.

While the invention has been described in detail, the foregoing description is in all aspects illustrative and not restrictive. It is understood that numerous other modifications and variations can be devised without departing from the scope of the invention.

We claim:

1. A contact pressure type semiconductor device, comprising:

a disciform semiconductor substrate with a ring-shaped gate electrode formed thereon;

a ring gate electrode in contact with said ring-shaped gate electrode;

a gate terminal having a first end portion in contact with said ring gate electrode, and a second end portion extending to an outside portion of the contact pressure type semiconductor device; and an insulation cylinder fixed to an intermediate portion of said gate terminal between said first and second end portions so as to sandwich said intermediate portion from above and below and to surround all of said semiconductor substrate, said ring gate electrode, and a portion of said gate terminal which ranges from said first end portion to said intermediate portion, wherein said gate terminal is made of a material that has a permeability of 15,000 or less in the CGS Gaussian system of units.

2. The contact pressure type semiconductor device of claim 1, wherein said gate terminal is a ring-shaped gate terminal, said ring-shaped gate terminal comprising an inner plane portion, said intermediate portion connected to said inner plane portion, and an outer plane portion connected to said intermediate portion, an inner end portion of said inner plane portion corresponding to said first end portion, an outer end portion of said outer plane portion corresponding to said second end portion.

3. The contact pressure type semiconductor device of claim 2, wherein said material for said ring-shaped gate terminal is a non-magnetic material.

4. The contact pressure type semiconductor device of claim 2, wherein said material for said ring-shaped gate terminal is determined based on a strength to fix said ring-shaped gate terminal to said insulation cylinder.

5. The contact pressure type semiconductor device of claim 4, wherein said ring-shaped gate terminal is metal with a thermal expansion coefficient of $0 \times 10^{-6}/°C.$ to $13 \times 10^{-6}/°C.$ at a temperature between 30° C. to 800° C.

6. The contact pressure type semiconductor device of claim 4, wherein said ring-shaped gate terminal is metal with Young's modulus of 60 to 210 GPa.

7. The contact pressure type semiconductor device of claim 2, wherein said ring-shaped gate terminal is metal containing at least copper as its main component.

8. The contact pressure type semiconductor device of claim 2, wherein said ring-shaped gate terminal is metal containing at least aluminum as its main component.

9. The contact pressure type semiconductor device of claim 2, wherein said ring-shaped gate terminal is metal containing at least molybdenum as its main component.

10. The contact pressure type semiconductor device of claim 2, wherein said ring-shaped gate terminal is metal containing at least iron as its main component.

11. The contact pressure type semiconductor device of claim 2, wherein said ring-shaped gate terminal is metal containing at least nickel as its main component.

12. The contact pressure type semiconductor device of claim 2, wherein said ring-shaped gate terminal is metal containing at least cobalt as its main component.

13. The contact pressure type semiconductor device of claim 2, wherein said ring-shaped gate terminal is metal containing at least chromium as its main component.

14. The contact pressure type semiconductor device of claim 2, wherein said ring-shaped gate terminal is metal containing at least manganese as its main component.

15. The contact pressure type semiconductor device of claim 2, wherein said ring-shaped gate terminal is metal containing at least titanium as its main component.

16. The contact pressure type semiconductor device of claim 2, further comprising a slit provided in said outer plane portion of said ring-shaped gate terminal, extending diametrically.

17. A contact pressure type semiconductor device comprising:

(a) a disciform semiconductor substrate with a ring-shaped gate electrode formed thereon;

(b) a ring gate electrode in contact with said ring-shaped gate electrode;

(c) gate terminal means for forming a path for gate current and preventing an induction heating function due to electromagnetic induction, said gate terminal means having a first end portion in contact with said ring gate electrode and a second end portion extending to an outside portion of the contact pressure type semiconductor device; and (d) an insulation cylinder fixed to an intermediate portion of said gate terminal means between said first and second end portions so as to sandwich said intermediate portion from above and below and to surround all of said semiconductor substrate, said ring gate electrode, and a portion of said gate terminal means which ranges from said first end portion to said intermediate portion.

* * * * *

UNITED STATES PATENT AND TRADEMARK OFFICE
CERTIFICATE OF CORRECTION

| | |
|---|---|
| PATENT NO. | : 6,323,547 B1 |
| DATED | : November 27, 2001 |
| INVENTOR(S) | : Kawamura et al. |

It is certified that error appears in the above-identified patent and that said Letters Patent is hereby corrected as shown below:

<u>Title page, item [54] and column 1,</u>
Title should read -- [54] PRESSURE CONTACT TYPE SEMICONDUCTOR DEVICE WITH RING-SHAPED GATE TERMINAL --

Signed and Sealed this

Thirtieth Day of April, 2002

Attest:

*Attesting Officer*

JAMES E. ROGAN
*Director of the United States Patent and Trademark Office*